(12) United States Patent
Trivedi et al.

(10) Patent No.: US 9,432,002 B2
(45) Date of Patent: Aug. 30, 2016

(54) HIGH-SPEED VOLTAGE LEVEL SHIFTER CIRCUIT

(71) Applicants: Kaushlendra Trivedi, New Delhi (IN); Gaurav Agrawal, Aligarh (IN); Ramji Gupta, Jhansi (IN); Luv Pandey, Aligarh (IN)

(72) Inventors: Kaushlendra Trivedi, New Delhi (IN); Gaurav Agrawal, Aligarh (IN); Ramji Gupta, Jhansi (IN); Luv Pandey, Aligarh (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 133 days.

(21) Appl. No.: 14/568,097

(22) Filed: Dec. 11, 2014

(65) Prior Publication Data

US 2016/0173070 A1 Jun. 16, 2016

(51) Int. Cl.
*H03K 5/08* (2006.01)
*H03K 3/012* (2006.01)
*H03K 3/356* (2006.01)

(52) U.S. Cl.
CPC ......... *H03K 3/356113* (2013.01); *H03K 3/012* (2013.01)

(58) Field of Classification Search
CPC .................. H03K 3/356113; H03K 3/012
USPC ....................... 327/333; 326/80, 81
See application file for complete search history.

(56) References Cited

U.S. PATENT DOCUMENTS

| | | | |
|---|---|---|---|
| 5,619,150 A * | 4/1997 | Briner ............... | H03K 3/35606 327/215 |
| 6,249,145 B1 * | 6/2001 | Tanaka ............. | H03K 3/356104 326/62 |
| 6,370,071 B1 * | 4/2002 | Lall ........................ | G11C 8/08 326/81 |
| 6,650,168 B1 | 11/2003 | Wang et al. | |
| 6,853,217 B2 * | 2/2005 | Tanaka ............. | H03K 3/356104 326/62 |
| 7,009,424 B2 | 3/2006 | Khan et al. | |
| 7,132,856 B2 * | 11/2006 | Hsu .................. | H03K 3/356156 326/81 |
| 7,352,209 B2 * | 4/2008 | Hsu ....................... | H03K 3/012 326/68 |
| 7,382,158 B2 | 6/2008 | Kimura | |
| 7,397,297 B2 | 7/2008 | Kimura | |
| 7,443,223 B2 | 10/2008 | Bajkowski et al. | |
| 7,446,566 B1 | 11/2008 | Chrudimsky | |
| 7,501,876 B2 | 3/2009 | Kimura | |
| 7,671,629 B2 | 3/2010 | Zhang et al. | |

(Continued)

*Primary Examiner* — Kenneth B Wells
(74) *Attorney, Agent, or Firm* — Charles E. Bergere

(57) ABSTRACT

A level shifter includes a latch having first and second branches, first and second outputs, first and second control switches in series between the respective branches and outputs, and a controller receiving first and second output signals and outputting first and second control signals to the first and second control switches for controlling activation thereof. In an initial state, the first output signal is in the first state, the first control switch is activated, the second output signal is in the second state, and the second control switch is deactivated. In a final state, the first output signal is in the second state, the first control switch is deactivated, the second output signal is in the first state, and the second control switch is activated. The controller changes the first and second control signals only after the first and second output signals reach the respective second and first states.

9 Claims, 2 Drawing Sheets

(56) References Cited

U.S. PATENT DOCUMENTS

| | | |
|---|---|---|
| 7,683,668 B1 | 3/2010 | Thakur et al. |
| 7,855,575 B1 * | 12/2010 | Hsu .................... H03K 3/35613 326/63 |
| 7,888,967 B2 * | 2/2011 | Majcherczak . H03K 19/018514 326/68 |
| 7,902,870 B1 | 3/2011 | Jiang |
| 8,198,916 B2 | 6/2012 | Sood et al. |
| 8,258,848 B2 | 9/2012 | Chen |
| 8,350,592 B1 | 1/2013 | Malhan et al. |
| 8,432,189 B1 | 4/2013 | Malhan et al. |
| 8,497,726 B2 | 7/2013 | Ryu et al. |
| 8,643,425 B2 | 2/2014 | Chaudhry et al. |
| 8,686,784 B2 | 4/2014 | Wang |
| 8,816,748 B2 | 8/2014 | Kumar et al. |

* cited by examiner

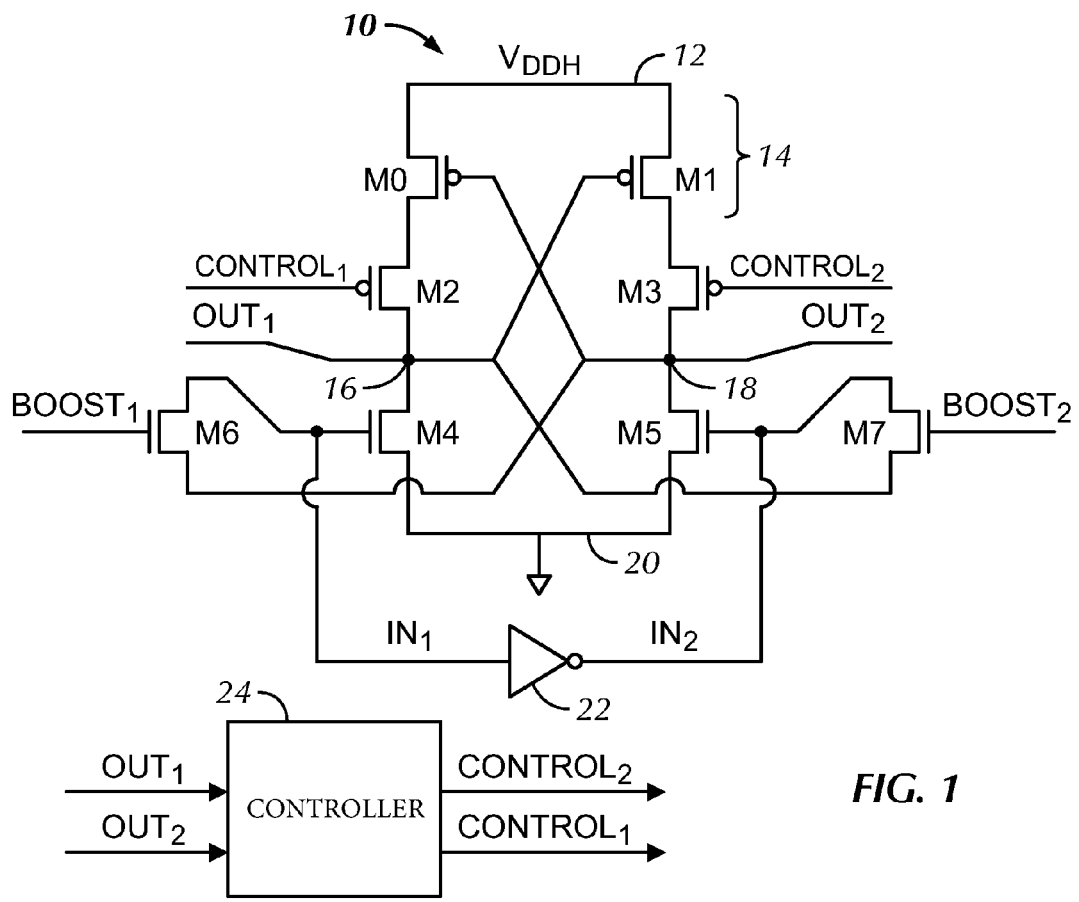
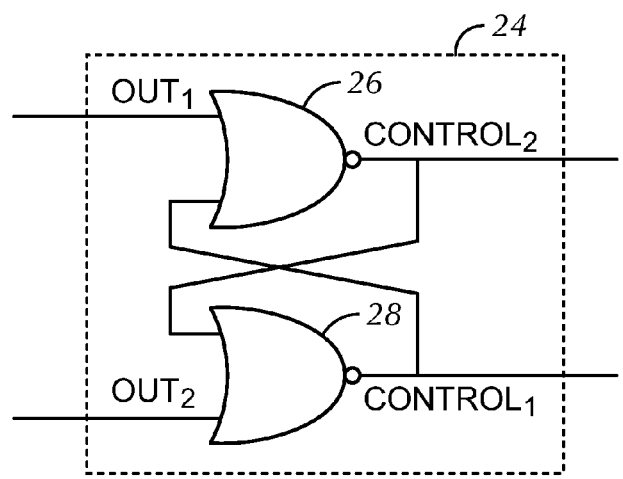
FIG. 1
FIG. 2

HIGH-SPEED VOLTAGE LEVEL SHIFTER CIRCUIT

BACKGROUND OF THE INVENTION

The present invention is directed to electronic circuitry and, more particularly, to voltage level shifters.

A semiconductor device, such as an integrated circuit (IC) or the like, may operate using multiple voltage levels. For example, an IC may have multiple internal modules having different functions and that require different operating voltages. A voltage level shifter is a circuit that is used to convert signal levels to higher or lower voltages.

Conventional level shifters include a latch connected to a supply voltage and having two branches, each including a p-type metal-oxide-semiconductor (MOS) or "PMOS" transistor. Each branch is connected to its own output node, and the gate of each PMOS transistor is coupled to the output node of the opposite branch. An n-type MOS or "NMOS" transistor is connected in series between the respective channel and a second voltage, such as ground. During operation, one output node is connected to the supply voltage via the corresponding PMOS transistor while the other output node is pulled to ground via the respective NMOS transistor.

However, complications arise during switching operations. The activation and deactivation of the transistors, particularly of the PMOS transistors, is not instantaneous. Thus, during switching, an output may be charged through the corresponding PMOS transistor while simultaneously being discharged through the respective NMOS transistor. This results in a delay in discharging the output node, and higher power consumption. In addition, the direct path created between the supply voltage and ground through the activated PMOS and NMOS transistors creates a phenomenon of "cross-bar current," which further degrades the circuit performance.

It is therefore desirable to provide a level shifter with improved switching speed, reduces cross-bar current, and consumes less power.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale. In the drawings:

FIG. 1 is a schematic circuit diagram of a level shifter in accordance with a first preferred embodiment of the present invention;

FIG. 2 is a schematic circuit diagram of a controller of the level shifter of FIG. 1;

DETAILED DESCRIPTION OF THE INVENTION

Figure 3:
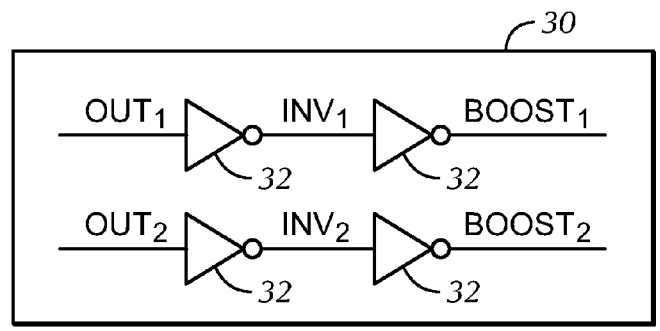
FIG. 3 is a schematic circuit diagram of a buffer circuit for use with the level shifter of FIG. 1.

In one embodiment, the present invention provides a level shifter including a latch supplied at a first voltage and having first and second branches. A first output is connected to the first branch and outputs a first output signal variable between a first state and a second state. A second output is connected to the second branch and outputs a second output signal variable between the first state and the second state. A first control switch element is connected in series between the first branch and the first output. A second control switch element is connected in series between the second branch and the second output. A first switch element is connected in series between the first output and a second voltage different from the first voltage. A second switch element is connected in series between the second output and the second voltage. A controller receives the first and second output signals and outputs a first control signal to the first control switch element for controlling activation thereof, and a second control signal to the second control switch element for controlling activation thereof. In an initial state of the level shifter, the first output signal is in the first state, the first control switch element is activated, the second output signal is in the second state, and the second control switch element is deactivated. In a final state of the level shifter, the first output signal is in the second state, the first control switch element is deactivated, the second output signal is in the first state, and the second control switch element is activated. The controller is configured to change the first and second control signals to deactivate the first control switch element and activate the second control switch element only after the first and second output signals reach the second and first states, respectively.

Referring now to the drawings, wherein the same reference numerals are used to designate the same components throughout the several figures, there is shown in FIG. 1 an embodiment of a level shifter 10 in accordance with the present invention. The level shifter 10 includes a pair of PMOS transistors M0, M1, the sources of which are connected to a supply rail 12 providing a voltage $V_{DDH}$. The drains of the PMOS transistors M0, M1 are respectively connected to the sources of first and second control switch elements M2, M3, which are described in further detail below. The source-drain paths of the PMOS transistors M0, M1 form first and second branches of a latch 14.

The first and second control switch elements M2, M3 are preferably also PMOS transistors. The drains of the first and second control switch elements M2, M3 are connected to first and second output nodes 16, 18. First and second switch elements M4, M5, preferably in the form of NMOS transistors, have their drains respectively connected to the first and second output nodes 16, 18 and their sources connected to a second rail 20 providing a voltage different from the supply rail 12, preferably a ground voltage. Thus, the first and second output nodes 16, 18 respectively output first and second output signals $OUT_1$, $OUT_2$, each of which is variable between a first state and a second state. Preferably, when an output signal $OUT_1$, $OUT_2$ is in the first state, the corresponding output node 16, 18 is at or near the supply voltage $V_{DDH}$, and in the second state, the corresponding output node 16, 18 is at the voltage of the second rail (e.g., ground).

The first output node 16 is preferably also cross-connected to the gate of the second control switch element M1, and similarly, the second output node 18 is preferably cross-connected to the gate of the first control switch element M0. Gates of the first and second switch elements M4, M5 receive a first input signal $IN_1$ and a second input signal $IN_2$, respectively. The second input signal $IN_2$ is preferably an inverted version of the first input signal $IN_1$, and may be derived by passing the first input signal $IN_1$ through an inverter 22 or the like, or vice versa. Alternatively, both input signals $IN_1$, $IN_2$ can be separate and independent supplied signals.

Gates of the first and second control switch elements M2, M3 preferably receive first and second control signals $CONTROL_1$, $CONTROL_2$, respectively. The first and second control signals $CONTROL_1$, $CONTROL_2$ control activation of the respective first and second control switch elements M2, M3, which can be used to prevent the simultaneous charging and discharging of the respective output nodes 16, 18, as described above in the conventional level shifter structure.

The first and second control signals $CONTROL_1$, $CONTROL_2$ are preferably output from a controller 24 receiving the first and second output signals $OUT_1$, $OUT_2$ as inputs. The controller 24 of the particular embodiment of FIG. 1 is shown in more detail in FIG. 2 as a logic circuit, more particularly a NOR latch. The controller 24 in FIG. 2 includes a first NOR gate 26 that receives the first output signal $OUT_1$ and the first control signal $CONTROL_1$ as inputs and outputs the second control signal $CONTROL_2$. A second NOR gate 28 is also provided and receives the second output signal $OUT_2$ and the second control signal $CONTROL_2$ as inputs and outputs the first control signal $CONTROL_1$. The controller 24 can alternatively be a microprocessor, application specific integrated circuit (ASIC), a logic circuit, combinations thereof, or the like. The controller 24 may, for example, be a larger ASIC or microprocessor incorporating or implementing (through logic) the NOR latch shown in FIG. 2.

An exemplary operation of the level shifter 10 will now be described in terms of a transition from an initial (i.e., first) state to a final (i.e., second) state. In the initial state of the example, the first input signal $IN_1$ is low, meaning that the first switch element M4 is deactivated, separating the first output node 16 from ground. Preferably, the first output node 16 is in the first state (i.e., at or near $V_{DDH}$). Conversely, the second input signal $IN_2$ is high, opening the second switch element M5 and allowing the second output node 18 to discharge to ground. The first control signal $CONTROL_1$ is high, which means the first control switch element M2 is deactivated. The second control signal $CONTROL_2$ is low, meaning the second control switch element M3 is activated. However, since the first output signal $OUT_1$ is at the supply voltage $V_{DDH}$, the PMOS transistor M1 in the second branch of the latch 14 is not conducting, so the second output node 18 is cut off from the supply rail 12.

In transition, the first input signal $IN_1$ changes from low to high, and the second input signal $IN_2$ goes from high to low. As a result, the first switch element M4 is activated, and the first output node 16 is permitted to discharge to ground, sending the first output signal $OUT_1$ low. The second switch element M5 is deactivated, disconnecting the second output node 18 from ground. Since the first output signal $OUT_1$ is low, and the second control signal $CONTROL_2$ is also still low, the second output node 18 is coupled to the supply rail 12 via the PMOS transistor M1 in the second branch of the latch 14 and the second control switch element M3, and can charge toward the supply voltage $V_{DDH}$.

As the second output node 18 charges, PMOS transistor M0 in the first branch of the latch 14 eventually deactivates. In a conventional level shifter, the delay in deactivating the PMOS transistor M0 in the first branch of the latch 14 allowed charge to flow to the first output node 16 while the output node 16 was simultaneously connected to ground. However, in the level shifter 10 shown in FIG. 1, the first control signal $CONTROL_1$ is still high, which allows the first control switch element to isolate the supply rail 12 from the first output node 16 while the PMOS transistor M0 in the first branch of the latch 14 slowly deactivates, allowing full discharge of the first output node 16 to ground without any delays caused by unintended charging.

Only after the first and second output nodes 16, 18 have reached their final new states (i.e., ground and at or near $V_{DDH}$, respectively), the controller 24 switches the first and second control signals $CONTROL_1$, $CONTROL_2$ to activate the first control switch element M2 and deactivate the second control switch element M3. Thus, upon the next switching operation of the level shifter 10, the second output node 18 is already isolated from the supply rail 12 to avoid discharge delays.

To aid in charging the first and second output nodes 16, 18, first and second boost switch elements M6, M7, preferably in the form of NMOS transistors, may be provided. The first boost switch element M6 is connected in series between the first input signal $IN_1$ and the second output node 18. In this way, when the first boost switch element M6 is activated, the first input signal IN1 may be applied to the second output node 18 to charge the second output node 18. Similarly, the second boost switch element M7 is connected in series between the second input signal $IN_2$ and the first output node 16 for similarly charging the first output node 16.

The first and second boost switch elements M6, M7 respectively receive first and second boost signals $BOOST_1$, $BOOST_2$ for controlling activation thereof. The first and second boost signals $BOOST_1$, $BOOST_2$ are preferably delayed versions of the first and second output signals $OUT_1$, $OUT_2$. For example, FIG. 3 shows a buffer circuit 30 which receives the first and second output signals $OUT_1$, $OUT_2$. The buffer circuit 30 may include a series of one or more inverters 32 which invert and delay the signals until the first and second boost signals $BOOST_1$, $BOOST_2$ are output. Other types of buffers or delay circuits may be used as well.

Operation of the first and second boost switch elements M6, M7 will now be described with reference to the previous description of the operations of the level shifter 10. In the previously described initial state, the first input signal $IN_1$ is low and the second input signal $IN_2$ is high. The first and second boost signals $BOOST_1$, $BOOST_2$ mirror the first and second output signals $OUT_1$, $OUT_2$, and therefore are at or near the supply voltage $V_{DDH}$ and ground, respectively. Consequently, the first boost switch element M6 is activated, but the first input signal $IN_1$ is low, meaning no charge is supplied to the second output node 18. The second boost switch element M7 is deactivated, isolating the first output node 16 from the second input signal $IN_2$.

After the first and second input signals $IN_1$, $IN_2$ switch states, the first output node 16 discharges to ground. However, because of the delay provided by the buffer 30 (FIG. 3), the first boost signal $BOOST_1$ temporarily remains high, allowing the first boost switch element M6 to pass the increasing input signal $IN_1$ to the second output node 18. Thus, the second output node 18 can begin to charge before the PMOS transistor M1 activates. The process is reversed on the next switching operation (i.e., the second boost switch element M7 passes the increasing second input signal $IN_2$ to the first output node 16). Accordingly, the first and second output nodes 16, 18 have two charging paths to accelerate the charging process.

In simulated testing, the level shifter 10 shown in FIG. 1 exhibits significant improvement over conventional level shifters with respect to the delays in rise and fall times of the output signal as measured from the change to the corresponding input signal. During the test, the rise time delay in a conventional circuit was about 693 picoseconds (ps), while the level shifter 10 of FIG. 1 exhibited a rise time delay of only 181 ps, a 74.8% improvement. Similarly, the fall time delay in a conventional circuit was about 626 ps, as compared to 173 ps for the level shifter 10 of FIG. 1, a 72.6% improvement.

Figure 4:
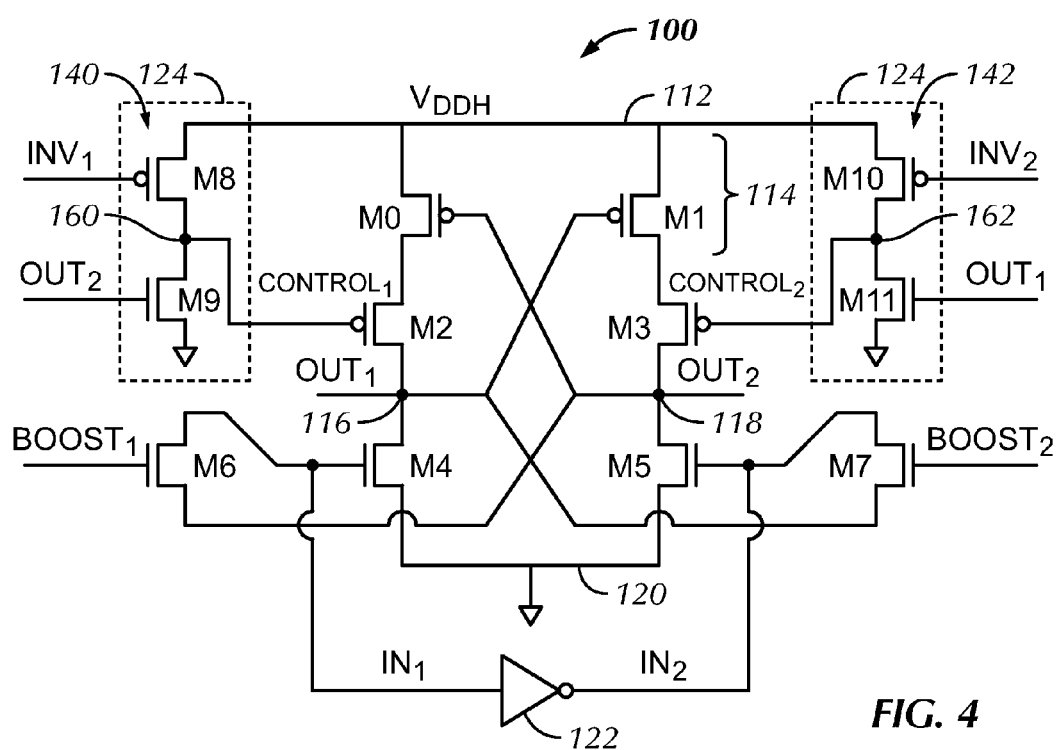
FIG. 4 is a schematic circuit diagram of a level shifter in accordance with a second preferred embodiment of the present invention.

Referring now to FIG. 4, a second embodiment of the level shifter is shown. The second embodiment is similar to the first embodiment described above. Like numerals have been used for like elements, except the 100 series numerals have been used for the second embodiment. Accordingly, a complete description of the second embodiment has been omitted, with only the differences being described.

The level shifter 100 shown in FIG. 4 has a controller 124 that includes first and second transistor pairs 140, 142, rather than the NOR latch shown in FIG. 2. The first transistor pair 140 includes a top transistor M8, preferably of the PMOS type, having its source connected to the supply rail 112 and its drain connected to a control node 160. A bottom transistor M9 has its drain connected to the same control node 160 and its source connected to ground. The first control signal $CONTROL_1$ is supplied by the control node 160 to the gate of the first control switch element M2.

The gate of the bottom transistor M9 is connected to the second output node 118, and therefore grounds the first control signal $CONTROL_1$ when the second output signal $OUT_2$ is at the supply voltage $V_{DDH}$. The gate of the top transistor M8 receives a gate signal $INV_1$, which is preferably a delayed and inverted version of the first output signal $OUT_1$. For example, the buffer circuit 30 in FIG. 3 may output the signal received by the top transistor M8 from a node (not shown) located between the inverters 32. Thus, the control node 160 is coupled to the supply voltage $V_{DDH}$ after the first output node 116 is also coupled to the supply voltage $V_{DDH}$.

The second transistor pair 142 is similar in that a top transistor M10 and bottom transistor M11 are connected in series between the supply rail 112 and ground, with a control node 162 in between. The gate of the bottom transistor M11 is connected to the first output node 116 and the gate of the top transistor M10 receives a gate signal $INV_2$, which is preferably a delayed, inverted version of the second output signal $OUT_2$.

In the foregoing specification, the invention has been described with reference to specific examples of embodiments of the invention. It will, however, be evident that various modifications and changes may be made therein without departing from the broader spirit and scope of the invention as set forth in the appended claims.

The connections discussed may be any type of connection suitable to transfer signals from or to the respective nodes, units or devices, for example via intermediate devices. Accordingly, unless implied or stated otherwise, the connections may be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, a plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed. Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The switch elements are described in preferred embodiments as being transistors, but other types of switching circuitry, such as mechanical switches, relays, or the like. In addition, while certain transistors are described as PMOS or NMOS type, the conductivities may be reversed in still keeping with the invention.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

In the claims, the word 'comprising' or 'having' does not exclude the presence of other elements or steps then those listed in a claim. Further, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The invention claimed is:

1. A level shifter, comprising:
   a latch supplied at a first voltage and having first and second branches;
   a first output connected to the first branch and outputting a first output signal variable between a first state and a second state, and a second output connected to the second branch and outputting a second output signal variable between the first state and the second state;
   a first control switch element connected in series between the first branch and the first output, and a second control switch element connected in series between the second branch and the second output;

a first switch element connected in series between the first output and a second voltage different from the first voltage, and a second switch element connected in series between the second output and the second voltage;

a controller receiving the first and second output signals and outputting a first control signal to the first control switch element for controlling activation thereof, and a second control signal to the second control switch element for controlling activation thereof;

a first boost switch element connected in series between a first input signal to the first switch element and the second output, and a second boost switch element connected in series between a second input signal to the second switch element and the first output, wherein in an initial state of the level shifter, the first output signal is in the first state, the first control switch element is activated, the second output signal is in the second state, and the second control switch element is deactivated, in a final state of the level shifter, the first output signal is in the second state, the first control switch element is deactivated, the second output signal is in the first state, and the second control switch element is activated, and wherein the controller is configured to change the first and second control signals to deactivate the first control switch element and activate the second control switch element only after the first and second output signals reach the second and first states, respectively.

2. The level shifter of claim 1, wherein the first and second switch elements are transistors, the first switch element having a gate connected to the first input signal and the second switch element having a gate connected to the second input signal.

3. The level shifter of claim 1, wherein the first boost switch element receives a first boost signal for controlling activation thereof, and the second boost switch element receives a second boost signal for controlling activation thereof.

4. The level shifter of claim 3, wherein the first boost signal is a delayed version of the first output signal and the second boost signal is a delayed version of the second output signal.

5. The level shifter of claim 4, further comprising a buffer receiving the first and second outputs and outputting the first and second boost signals.

6. The level shifter of claim 1, wherein the controller includes a first transistor pair and a second transistor pair, each transistor pair having a top transistor and a bottom transistor connected in series between the first voltage and the second voltage, the first control signal being output from a node between the top and bottom transistors of the first transistor pair, and the second control signal being output from a node between the top and bottom transistors of the second transistor pair.

7. The level shifter of claim 6, wherein a gate of the bottom transistor of the first transistor pair is connected to the second output and a gate of the bottom transistor of the second transistor pair is connected to the first output.

8. The level shifter of claim 7, wherein a gate of the top transistor of the first transistor pair receives a delayed and inverted version of the first output signal, and a gate of the top transistor of the second transistor pair receives a delayed and inverted version of the second output signal.

9. A level shifter circuit, comprising:

a latch supplied at a first voltage and having first and second branches;

a first output connected to the first branch and outputting a first output signal variable between a first state and a second state, and a second output connected to the second branch and outputting a second output signal variable between the first state and the second state;

a first control switch element connected in series between the first branch and the first output, and a second control switch element connected in series between the second branch and the second output;

a first switch element connected in series between the first output and a second voltage different from the first voltage, and a second switch element connected in series between the second output and the second voltage; and a controller receiving the first and second output signals and outputting a first control signal to the first control switch element for controlling activation thereof, and a second control signal to the second control switch element for controlling activation thereof, wherein in an initial state of the level shifter, the first output signal is in the first state, the first control switch element is activated, the second output signal is in the second state, and the second control switch element is deactivated, in a final state of the level shifter, the first output signal is in the second state, the first control switch element is deactivated, the second output signal is in the first state, and the second control switch element is activated, and wherein the controller is configured to change the first and second control signals to deactivate the first control switch element and activate the second control switch element only after the first and second output signals reach the second and first states, respectively, and wherein the controller includes a NOR latch comprising a first NOR gate receiving the first output signal and the first control signal as inputs and outputting the second control signal, and a second NOR gate receiving the second output signal and the second control signal as inputs and outputting the first control signal.

\* \* \* \* \*